United States Patent
Kwon et al.

(10) Patent No.: US 7,304,537 B2
(45) Date of Patent: Dec. 4, 2007

(54) POWER AMPLIFICATION APPARATUS OF A PORTABLE TERMINAL

(75) Inventors: Youngwoo Kwon, Sungnam-Shi (KR); Junghyun Kim, Seoul (KR); Seong-Jun Bae, Seoul (KR)

(73) Assignee: Avago Technologies Korea Co., Ltd (KR)

( * ) Notice: Subject to any disclaimer, the term of this patent is extended or adjusted under 35 U.S.C. 154(b) by 0 days.

(21) Appl. No.: 11/590,311

(22) Filed: Oct. 31, 2006

(65) Prior Publication Data

US 2007/0057722 A1 Mar. 15, 2007

Related U.S. Application Data

(63) Continuation of application No. 10/432,553, filed as application No. PCT/KR02/00163 on Feb. 4, 2002.

(30) Foreign Application Priority Data

Feb. 1, 2002 (KR) .................................. 2002-5924

(51) Int. Cl.
  *H03F 3/68* (2006.01)
(52) U.S. Cl. ................... 330/124 R; 330/295; 330/296
(58) Field of Classification Search ............ 330/124 R, 330/10, 52–54, 286, 295, 296
See application file for complete search history.

(56) References Cited

U.S. PATENT DOCUMENTS

| | | | |
|---|---|---|---|
| 2,210,028 A | | 8/1940 | Doherty |
| 4,335,363 A | | 6/1982 | Bowers |
| 5,420,541 A | | 5/1995 | Upton et al. |
| 5,568,086 A | * | 10/1996 | Schuss et al. ............ 330/124 R |
| 5,739,723 A | | 4/1998 | Sigmon et al. |
| 5,757,229 A | * | 5/1998 | Mitzlaff .................. 330/124 R |
| 5,786,727 A | | 7/1998 | Sigmon |
| 5,880,633 A | | 3/1999 | Leizerovich et al. |
| 5,886,575 A | | 3/1999 | Long |
| 6,084,468 A | | 7/2000 | Sigmon et al. |
| 6,097,252 A | * | 8/2000 | Sigmon et al. ............. 330/136 |
| 6,128,479 A | | 10/2000 | Fitzpatrick et al. |
| 6,175,273 B1 | * | 1/2001 | Sigmon et al. ............... 330/10 |

(Continued)

FOREIGN PATENT DOCUMENTS

WO   WO 03/065599   8/2003

OTHER PUBLICATIONS

Masaya Iwamoto, et al., "An Extended Doherty Amplifier with High Efficiency Over a Wide Power Range", IEEE Transactions of Microwave Theory and Technigues, vol. 49, No. 12, Dec. 2001, pp. 2472-2479.

(Continued)

*Primary Examiner*—Linh V. Nguyen

(57) ABSTRACT

The present invention relates to a power amplification circuit of a mobile device for improving the efficiency and the linearity properties of the power amplifier. In one embodiment, the power amplifier improves these properties by controlling the input voltage of the supplemental amplifier so that the power amplifier operates as the Doherty mode in the low output power mode depending on the magnitude of the output power from the output unit and so that the input voltage of the supplemental amplifier may be increased up to satisfy the non-linear operational requirements of a power amplifier in the high output power mode. Moreover, because only the input voltage of the supplemental amplifier is controlled, the power amplifier can be implemented in a simple manner. Thus, the size of the power amplifier becomes small, which in turn reduces the cost of the power amplifier, among other things.

3 Claims, 6 Drawing Sheets

U.S. PATENT DOCUMENTS

| | | | |
|---|---|---|---|
| 6,262,629 B1 | 7/2001 | Stengel et al. | |
| 6,285,251 B1 | 9/2001 | Dent et al. | |
| 6,320,462 B1* | 11/2001 | Alley | 330/124 R |
| 6,329,462 B1 | 12/2001 | Hale et al. | |
| 6,356,149 B1* | 3/2002 | Stengel et al. | 330/107 |
| 6,374,092 B1* | 4/2002 | Leizerovich et al. | 455/127.4 |
| 6,396,341 B1 | 5/2002 | Pehlke | |
| 6,469,581 B1* | 10/2002 | Kobayashi | 330/295 |
| 6,617,929 B2 | 9/2003 | Kim et al. | |
| 6,731,173 B1* | 5/2004 | Thompson | 330/296 |
| 6,737,922 B2* | 5/2004 | Pengelly et al. | 330/295 |
| 6,745,046 B1 | 6/2004 | Eckert et al. | |
| 6,791,417 B2* | 9/2004 | Pengelly et al. | 330/295 |
| 6,853,245 B2* | 2/2005 | Kim et al. | 330/124 R |
| 6,864,742 B2* | 3/2005 | Kobayashi | 330/124 R |
| 7,053,706 B2 | 5/2006 | Kwon et al. | |
| 7,061,314 B2 | 6/2006 | Kwon et al. | |
| 7,109,790 B2 | 9/2006 | Kwon et al. | |
| 2002/0186079 A1* | 12/2002 | Kobayashi | 330/124 R |
| 2004/0119535 A1 | 6/2004 | Hunton et al. | |
| 2004/0174212 A1 | 9/2004 | Kim et al. | |
| 2004/0189381 A1* | 9/2004 | Louis | 330/124 R |
| 2005/0134377 A1* | 6/2005 | Dent | 330/124 R |
| 2006/0119428 A1 | 6/2006 | Lee et al. | |
| 2006/0145757 A1 | 7/2006 | Kim et al. | |

OTHER PUBLICATIONS

Frederick H. Raab, "Efficiency of Doherty RF Power-Amplifier Systems", IEEE Transactions on Broadcasting, vol. BC-33, No. 3, Sep. 1987.

Laurie Wallace, "Amplifier Linearization Promotes Efficiency in Multi-Carrier WCDMA Basestation", EE Times, Oct. 18, 2002, at www.eetimes.com/story/OEG20021018S0059.

Seongjun Bae, et al., "Bias-Switching Quasi-Doherty-Type Amplifier for CDMA Handset Applications", 2003 IEEE MTT-S Digest, pp. 137-140.

Jonathan Lees, et al., "Single-Tone Optimisation of an Adaptive-Bias Doherty Structure", 2003 IEEE MTT-S Digest, pp. 2213-2216.

Yu Zhao, et al., "Doherty Amplifier with DSP Control to Improve Performance in CDMA Operation", 2003 IEEE MTT-S Digest, pp. 687-690.

* cited by examiner

POWER AMPLIFICATION APPARATUS OF A PORTABLE TERMINAL

RELATED APPLICATIONS

The present application is a continuation application under 37 C.F.R. § 1.53(b) of U.S. patent application Ser. No. 10/432,553, entitled POWER AMPLIFICATION APPARATUS OF PORTABLE TERMINAL and filed on Apr. 26, 2004. The present application claims priority from this application under 35 U.S.C. § 120. The disclosure of this application is specifically incorporated herein by reference.

This U.S. nonprovisional application is a National Stage application for and claims priority to International Application No. PCT/KR02/00163, filed Feb. 4, 2002, which claims priority to Korean Utility Patent Application No. 2002-5924, filed on Feb. 1, 2002, both of which are incorporated by reference herein for all purposes.

TECHNICAL FIELD

The present invention relates to a power amplification circuit for use in wireless communication technologies, and more particularly to a power amplifier circuit in a mobile handset.

BACKGROUND ART

As mobile handsets used for wireless communication services are becoming smaller and lighter, battery size and power is also decreasing. Consequently, the effective talk time (i.e., transmission time) of mobile computing devices, mobile phones, and the like (i.e., handsets) is reduced.

In a conventional mobile handset, the Radio Frequency (RF) power amplifier consumes most of the power consumed in contrast to the overall system of the mobile handset. Thus, the RF power amplifier having a low efficiency typically results in degradation of the efficiency for the overall system, and accordingly reduces the talk time.

For this reason, much effort has been concentrated on increasing efficiency of the RF power amplifier in the field of power amplification. In one approach, a Doherty-type power amplifier has been introduced recently as a circuit for increasing efficiency of the RF power amplifier. Unlike other conventional power amplifiers, whose efficiency is low over the low output power range, the Doherty-type power amplifier is designed to maintain an optimum efficiency over a wide output power range (e.g., in low, intermediate, and high output power ranges).

A common Doherty-type power amplifier design includes both a carrier and a peak amplifier. The carrier amplifier (i.e., power or main amplifier), which is composed of relatively small transistors, operates to maintain the optimal efficiency up to a certain low output power level. The peak amplifier (i.e., supplemental or auxiliary amplifier) operates in cooperative fashion with the carrier amplifier to maintain a high efficiency until the power amplifier, as a whole, produces a maximum output power. When the power amplifier operates within a low power output range, only the carrier amplifier is operational; the peak amplifier, being biased as a class B or C, does not operate. But, when the power amplifier operates within a high power output range, the peak amplifier is active and may introduce nonlinearity into the overall power amplifier since the peak amplifier is biased as a highly nonlinear class B or class C amplifier.

Theoretically, the above-mentioned Doherty-type power amplifier is designed to operate while meeting the linearity specification over an entire output power range and where high efficiency is maintained. However, as described above, because the Doherty-type power amplifier comprises a carrier amplifier and a peak amplifier that operate with each other, the Doherty-type power amplifier in practice does not satisfy the linearity specification (e.g., in terms of phase or gain characteristics) over the entire output power range where high efficiency is maintained.

In summary, in the above-mentioned Doherty-type power amplifier in the related art, the linearity characteristics of such a power amplification device are difficult to predict, which makes it difficult to improve such linearity characteristics because the peak amplifier is biased at a relatively constant, low DC current level, such as a current to set the peak amplifier as a class B or C amplifier.

BRIEF SUMMARY OF THE INVENTION

There is a need to overcome the drawbacks of the prior art and to provide at least advantages described hereinafter. In order to solve the above problems pertaining to the previous technology, a specific embodiment of the present invention provides a power amplifier in a mobile handset that improves efficiency and linearity by controlling, for example, input DC-bias voltage applied to a peak amplifier according to the output power levels. Specifically, in the low output power mode, input DC-bias voltage applied to the peak amplifier is controlled so that the power amplifier is operated in the Doherty mode and, in the high output power mode, input DC-bias voltage applied to the peak amplifier is controlled to be increased so as to sufficiently manage the non-linearity characteristic of the power amplifier.

The power amplifier in a mobile handset according to one embodiment of the present invention comprises a phase difference compensation means, coupled to input terminals of a carrier amplifier and a peak amplifier, for compensating phase difference to equalize phases of output powers from the carrier amplifier and the peak amplifier at an output stage of the power amplifier, an output matching unit for transmitting the output powers from the carrier amplifier and the peak amplifier to the output stage, and a voltage control means for detecting the level of the output power transmitted to the output stage and controlling input DC-bias voltage applied to the peak amplifier in accordance with the detected output power level.

In one embodiment, the phase difference compensation means is implemented with a 3 dB hybrid coupler, for example, for distributing certain input powers to the carrier amplifier and the peak amplifier, minimizing interference between the carrier amplifier and the peak amplifier and transmitting signals in such a manner that the phase of input power applied to the peak amplifier is substantially 90° delayed from the phase of input power applied to the carrier amplifier.

Preferably, the phase difference compensation means includes a phase difference compensator, connected in between the input stage of the power amplifier and the peak amplifier, for delaying the phase of input signal applied to the peak amplifier by 90° from the phase of input signal applied to the carrier amplifier.

In one embodiment, the voltage control means comprises an envelope detector for detecting the level of output power transmitted from the output matching unit to the output stage, a comparison and determination unit for determining by comparison whether the output power level detected by the envelope detector deviates from the low output power range, and a voltage controller for controlling input DC-bias voltage applied to the peak amplifier according to the result of the determination made by the comparison and determination unit.

The voltage control means controls input DC-bias voltage applied to the peak amplifier in such a manner that the power amplifier is operated in the Doherty mode if the level of output power transmitted from the output matching unit to the output stage is within the low output power range. On the other hand, if the level of output power transmitted from the output matching unit to the output stage deviates from the low output power range, the voltage control means controls input DC-bias voltage applied to the peak amplifier in such a manner that the input DC-bias voltage applied to the peak amplifier is increased up to the point satisfying the non-linearity characteristic of the power amplifier.

DETAILED DESCRIPTION OF SPECIFIC EMBODIMENTS

Hereinafter, a detailed description will be given with reference to the attached drawings as to an exemplary power amplifier in a mobile handset in accordance with various embodiments of the present invention.

Figure 1:
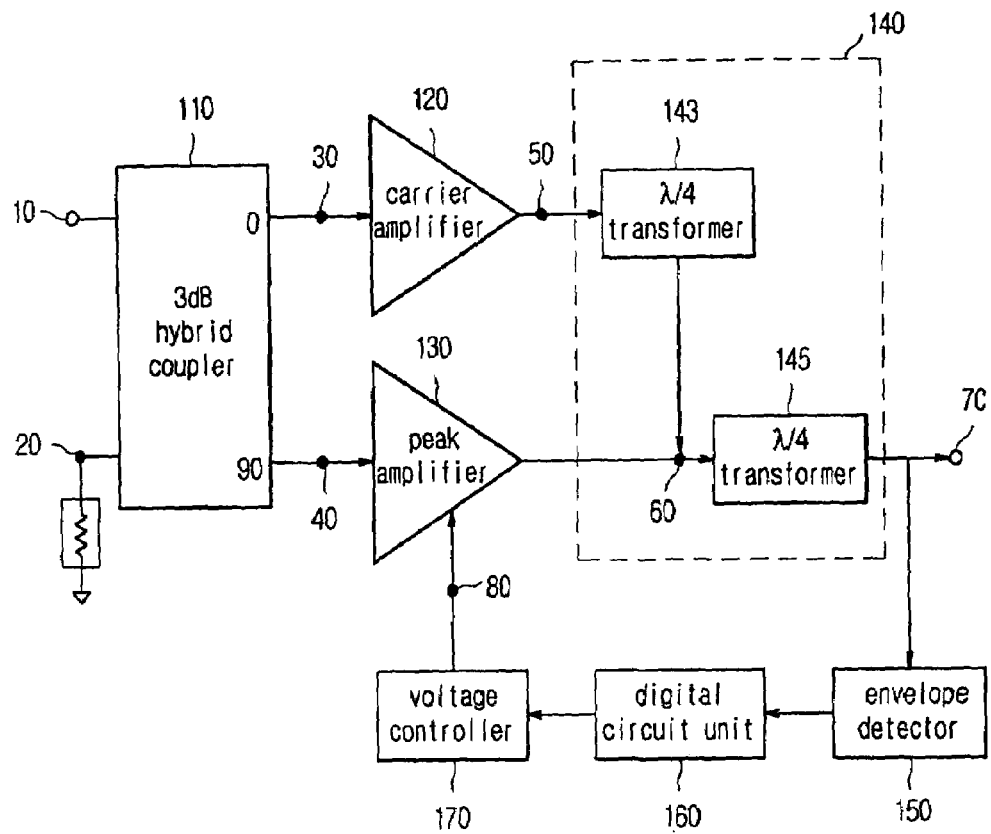
FIG. 1 is a block diagram showing the structure of a power amplifier in a mobile handset in accordance with one embodiment of the present invention.

FIG. 1 illustrates the structure of an exemplary power amplifier in a mobile handset in accordance with a specific embodiment of the present invention. The power amplifier 100 illustrated in FIG. 1 comprises a hybrid coupler, such as exemplary 3 dB hybrid coupler 110, a carrier amplifier 120, a peak amplifier 130, an output matching unit 140, an envelope detector 150, a digital circuit unit 160 and a voltage controller 170.

3 dB hybrid coupler 110 distributes certain input powers to carrier amplifier 120 and peak amplifier 130, minimizes interference between carrier amplifier 120 and peak amplifier 130 and transmits signals in such a manner that the phase of input power of peak amplifier 130 is 90° ($\lambda/4$) delayed from the phase of input power of carrier amplifier 120. Accordingly, the 90° ($\lambda/4$) phase delay occurring at the output matching unit 140 between the phases of output powers from carrier amplifier 120 and peak amplifier 130 is compensated and the phases of output powers at the output stage are equalized.

As described above, 3 dB hybrid coupler 110's compensation of phase difference between the phases of output powers from carrier amplifier 120 and peak amplifier 130 obtains the optimum output power by equalizing the phases of output powers at the output stage.

Figure 2:
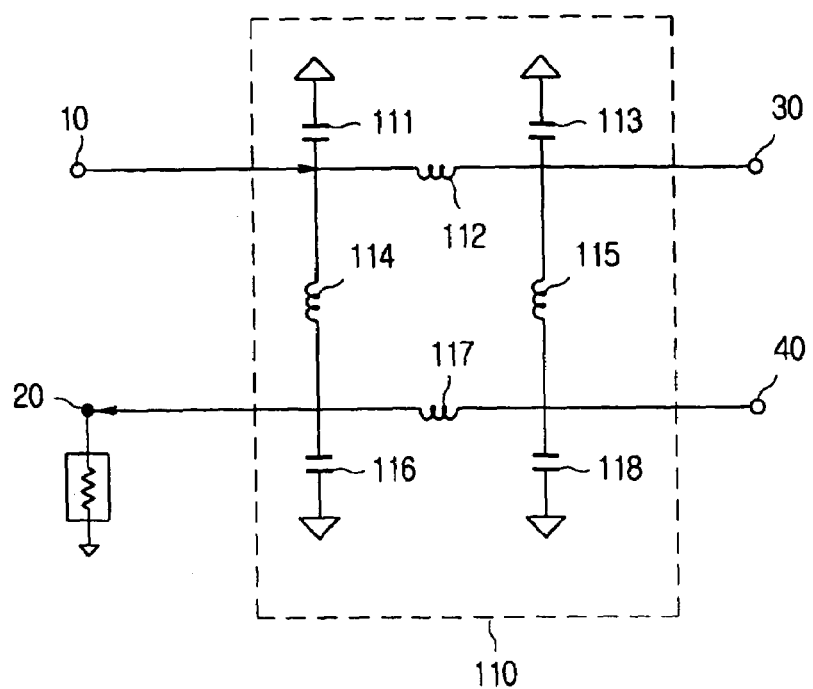
FIG. 2 shows an equivalent circuit of a 3 dB hybrid coupler that can be used in the power amplifier of FIG. 1.

FIG. 2 shows an equivalent circuit of 3 dB hybrid coupler 110 in accordance with one embodiment of the present invention. After signals are inputted into input stage 10 of 3 dB hybrid coupler 110, which has the signal coupling of about 3 dB or more, such signals are transmitted to the carrier amplifier output terminal 50 and to the peak amplifier output terminal 60. At this time, the signal outputted to the carrier amplifier output terminal 50 and the signal outputted to the peak amplifier output terminal 60 have a phase difference at or about 90° ($\lambda/4$, or quarter-wave).

As an example, 3 dB hybrid coupler 110 can be implemented with a transmission line, such as a coupled line coupler, a Lange coupler, a branch line coupler or other like coupling circuits known in the art. As another example, 3 dB hybrid coupler 110 may be implemented using a Microwave Monolithic Integrated Circuit (MMIC) chip technology, such as GaAS or any other known semiconductor technologies. That is, exemplary hybrid coupler 110 can be fabricated as an integrated circuit, which can be packaged as a single power amplifier device or chip. In yet another example, 3 dB hybrid coupler 110 may be implemented with lumped elements 111, 112, 113, 114, 115, 116, 117 and 118, as shown in FIG. 2. In still yet another example, 3 dB hybrid coupler 110 may be implemented by the Low Temperature Co-fired Ceramic (LTCC) method or other similar technologies.

The carrier amplifier 120 amplifies signals outputted from 3 dB hybrid coupler 110 and outputs the amplified signals. In one example, carrier amplifier 120 includes a transistor that can be sized smaller than that of a transistor constituting peak amplifier 130. The ratio of a transistor's size to the other transistor's size, in part, determines an output power range over which the maximum efficiency can be maintained. The higher this ratio, the wider the output power range over which the maximum efficiency can be maintained. One having ordinary skill in the art should appreciate that each amplifier can include one or more transistors or other like circuit elements. Further, that the ordinarily skilled artisan should recognize that carrier amplifier 120 and peak amplifier 130 can be implemented in any known semiconductor technologies, such as Si LDMOS, GaAS MESFET, GaAs pHEMT, GaAs HBT, or the like.

Peak amplifier 130, which is another amplifier for amplifying signals outputted from 3 dB hybrid coupler 110 and outputting the amplified signals, is not substantially operated while low-level input signals are applied to carrier amplifier 120. This is made possible by adjusting the level of input DC-bias voltage applied to peak amplifier 130 in such a way that peak amplifier 130 is biased at class B or C, where little or no DC current flows. Over the low output power range where peak amplifier 130 is not substantially operated, carrier amplifier 120 has an output impedance having a relatively constant and high value. Since the peak amplifier does not draw any current, the overall amplifier 100 can obtain improved efficiency at an output power level which is lower than the highest output power level that carrier amplifier 120 can generate.

Output matching unit 140 includes a first $\lambda/4$ transformer 143 for matching impedance of output power applied from carrier amplifier 120 and transmitting the output power applied from carrier amplifier 120 to output stage 70; and a second $\lambda/4$ transformer 145 for matching impedance of output power applied from peak amplifier 130 and carrier amplifier 120 and transmitting the output power applied from peak amplifier 130 and carrier amplifier 120 to output stage 70. First $\lambda/4$ transformer 143 operates as an impedance inverter and is used to provide an impedance at terminal 50 (of FIG. 1) that is inverted from the impedance at terminal 60.

Figure 3:
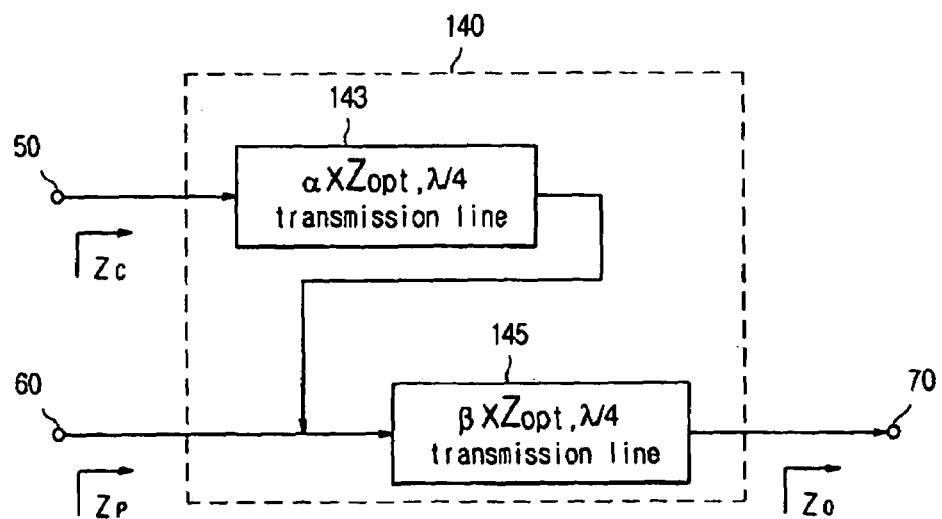
FIG. 3 is a block diagram of an exemplary output matching unit illustrated in FIG. 1.

FIG. 3 is a block diagram of output matching unit 140 illustrated in FIG. 1. By adjusting α and β (either individually or both) of first λ/4 transformer 143 and second λ/4 transformer 145, respectively, in output matching unit 140, the characteristic impedances of the two λ/4 transformer lines change. By optimizing α and β, the carrier amplifier 120 may achieve the maximum efficiency at an output power level that is lower than the highest output power level that carrier amplifier 120 may generate.

Figure 4:
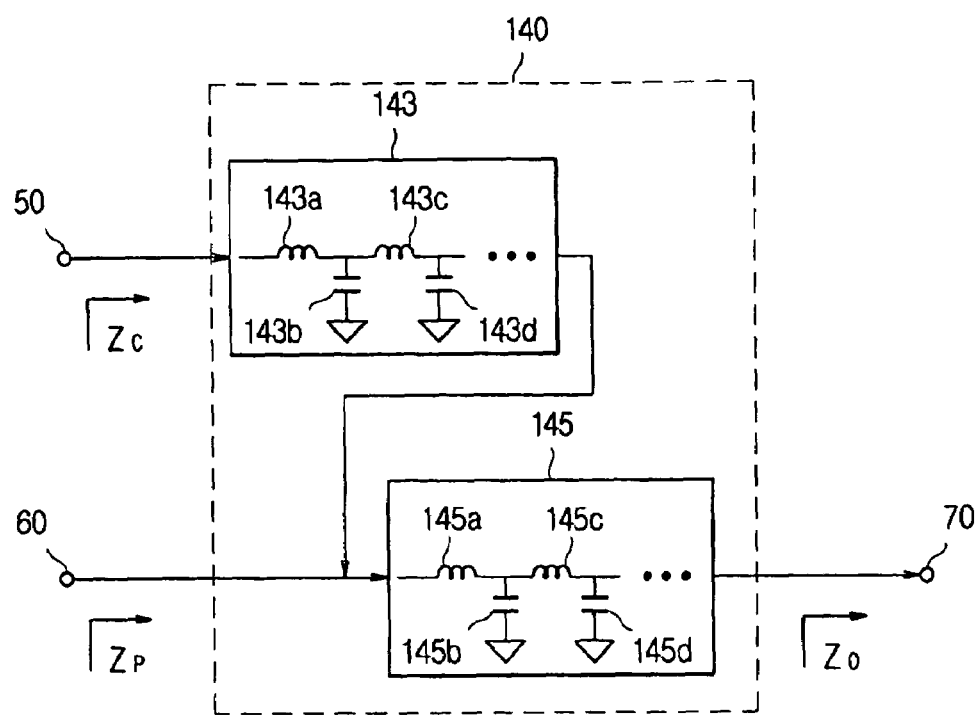
FIG. 4 shows an equivalent circuit of an exemplary output matching unit implemented with lumped elements.

First λ/4 transformer 143 and second λ/4 transformer 145 may be implemented with λ/4 transmission lines (T-lines), as shown in FIG. 3, or with lumped elements 143a, 143b, 143c, 143d, . . . , 145a, 145b, 145c, 145d, etc., as shown in FIG. 4, or with like elements. Alternatively, first λ/4 transformer 143 and second λ/4 transformer 145 may be implemented by the LTCC method. As another example, first λ/4 transformer 143 and second λ/4 transformer 145 can be formed as a single integrated circuit.

Envelope detector 150 detects the level of output power transmitted from output matching unit 140 to output stage 70, and can be constructed with known circuits so as to detect the output power signal's level. Digital circuit unit 160 is configured to determine whether the output power level detected by the envelope detector 150 deviates from the low output power range Q and applies a control signal to the voltage controller 170 according to the result of the determination. Voltage controller 170 is configured to control the level of input DC-bias voltage applied to peak amplifier 130 based on the control signal applied from the digital circuit unit 160.

Figure 5:
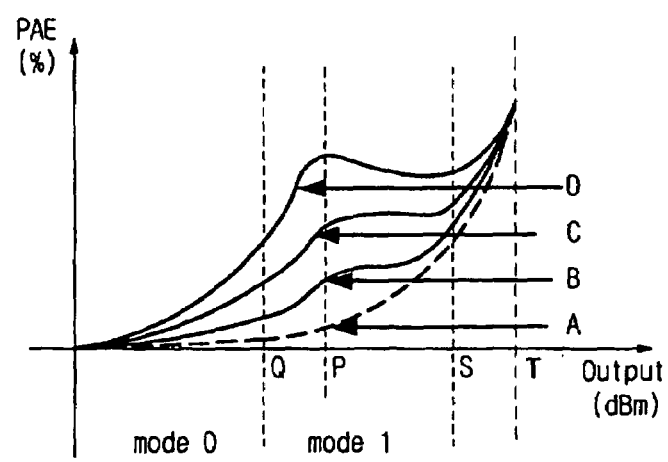
FIG. 5 is a graph illustrating efficiency characteristics dependent on input DC-bias voltage applied to an exemplary peak amplifier.

FIG. 5 is a graph illustrating efficiency characteristics as determined by, for example, the input DC-bias voltage applied to peak amplifier 130. Mode 0 represents the region of amplifier operation in a low power range (i.e., from a zero output power in dBm to point Q) when the carrier amplifier is operating and the peak amplifier is biased as a class B or C. In this low power range, the power amplifier operates similar to a Doherty amplifier. Mode 1 represents the region of amplifier operation in a high power range (i.e., from point Q to point S and/or T). As a current is increasingly applied to the peak amplifier, an exemplary power amplifier according to an embodiment operates first as shown as curve D. Curves C and B represent the efficiency characteristics associated with the power amplifier as the amount of bias current increases beyond that associated with curve D. Curve A represents the efficiency characteristics of a general power amplifier.

As a current starts to flow in peak amplifier 130, peak amplifier 130 commences its operation. This changes the output impedance of carrier amplifier 120, thereby optimizing efficiency of power amplifier 100 to a certain constant level as indicated by D in FIG. 5. Accordingly, as indicated by curve D in FIG. 5, the Power Added Efficiency (PAE) has the maximum value from the point P (when peak amplifier 130 starts to operate) to either point S, which is the highest allowable output power satisfying the given linearity conditions, or point T, which is the saturated output power, as generated by power amplifier 100. Thus, as illustrated, improved efficiency characteristics are achieved through an exemplary power amplifier, according to an embodiment of the present invention, in comparison with the efficiency characteristic of a general power amplifier indicated by curve A in FIG. 5. As described above, this is made possible by operating the peak amplifier 130 at class B or C.

Figure 6:
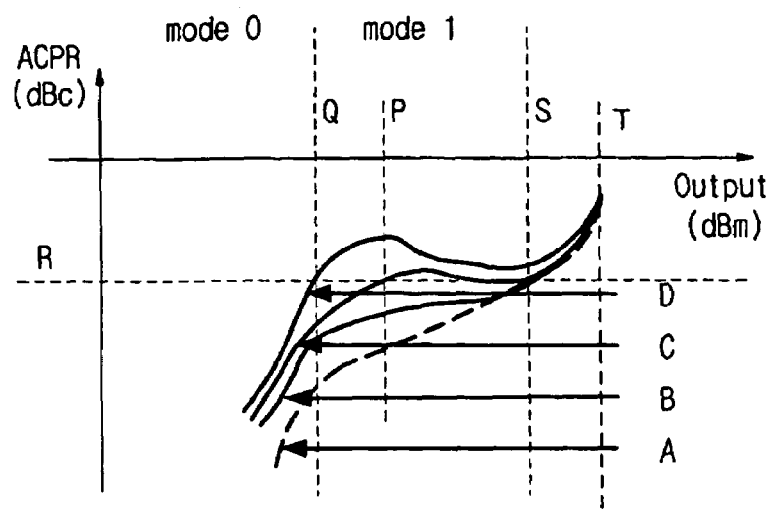
FIG. 6 is a graph illustrating non-linearity characteristics dependent on input DC-bias voltage applied to an exemplary peak amplifier.

However, illustrated by the graph of FIG. 6 are non-linearity characteristics as an input DC-bias voltage is applied to peak amplifier 130. In this graph, the power amplifier's performance is characterized with respect to the Adjacent Channel Power Ratio (ACPR) as the output power is increased. In this instance, values of the overall non-linearity characteristics (as indicated by curve D in FIG. 6) may be difficult to predict and, thus, the non-linear distortion of the power amplifier becomes undesirable. Accordingly, ACPR criterion R, which may be required by a specific system, may not be maintained up to the desired output power level associated with point S without violating the ACPR criteria. ACPR criteria are well known and those having ordinary skill in the art understand that R could, for example, represent −42 dBc for a CDMA cellular system or any other value.

In other words, as illustrated in FIG. 5 and FIG. 6, compared with general power amplifiers known in the related art, and if peak amplifier 130 in the power amplifier 100 is operated at class B or C (that is, if the power amplifier 100 is operated in a typical Doherty mode), then power amplifier 100 shows improved efficiency characteristics over conventional power amplifiers used, for example, in wireless communication applications. However, in terms of linearity, the power amplifier might have less predictable values when operating in the high output power range.

Therefore, an exemplary power amplifier in accordance with an embodiment of the present invention meets high efficiency and linearity requirements in the low output power range, such as at point Q, where the ACPR criterion R required by the system is satisfied. Criterion R is met by setting the input DC bias voltage applied to the peak amplifier 130 in such a way that the peak amplifier 130 can be operated during mode 0 at class B or C where little DC current flows, and thus that the power amplifier 100 is operated in the Doherty mode. On the other hand, in the high output power range during mode 1, the power amplifier achieves excellent linearity by adjusting input DC bias voltage applied to peak amplifier 130 in such a way that the power amplifier 100 is operated in the different classes of bias. This can be achieved by increasing the bias voltage to a base terminal for a BJT (bipolar junction transistor), to a gate terminal for a FET (field effect transistor), or the like, up to the point where a linearity specification (or level of linearity) designated as R in FIG. 6 can be satisfied. In this way, peak amplifier can be biased as a class AB amplifier depending on, for example, the mode of operation. This results in the efficiency and linearity curves of B and C in FIGS. 5 and 6.

Figure 7:
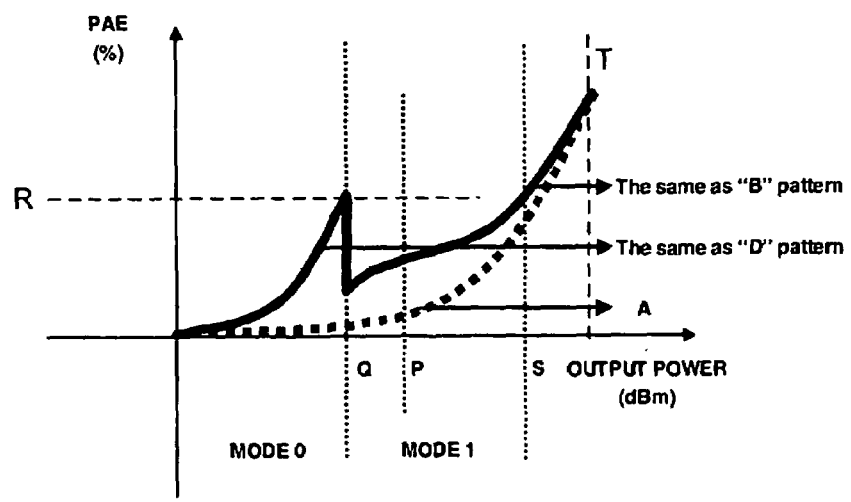
FIG. 7 is a graph illustrating efficiency characteristics corresponding to modes of the power amplifier in accordance with one embodiment of the present invention.
Figure 8:
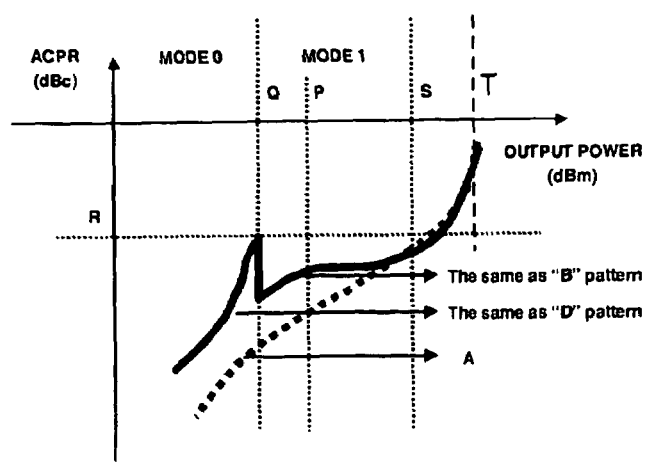
FIG. 8 is a graph illustrating non-linearity characteristics corresponding to modes of the power amplifier in accordance with a specific embodiment of the present invention.

FIG. 7 is a graph illustrating efficiency characteristics corresponding to modes of the power amplifier in accordance with an embodiment of the present invention. FIG. 8 is a graph illustrating non-linearity characteristics corresponding to modes of the power amplifier in accordance with the present invention. In operation of an exemplary power amplifier, consider FIG. 8. As the output power is increased, the envelope detector will monitor the output power levels. When the envelope detector detects an output power level reaching point Q, where mode switching is needed, the digital circuit unit sends a control signal to the peak amplifier so that an increased bias current may be applied to the peak amplifier. In this way, linearity of an exemplary power amplifier in accordance with an embodiment of the present invention is enhanced with a slight reduction in the efficiency. The efficiency and linearity curves in mode 1 is similar to those of curve B. This prevents criteria R from being violated.

Figure 9:
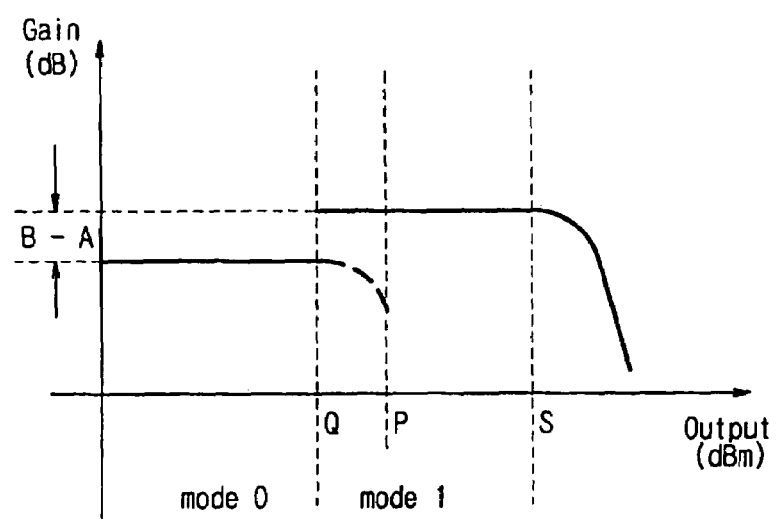
FIG. 9 is a graph illustrating gain characteristics corresponding to modes of the power amplifier in accordance with the present invention.

FIG. 9 is a graph illustrating gain characteristics corresponding to modes of the power amplifier in accordance with the present invention. In the present invention, the carrier amplifier 120 and the peak amplifier 130 may be operated to have the same linear gain characteristics. However, the overall system is not affected even if the carrier amplifier 120 and the peak amplifier 130 are implemented to be operated with different linear gain characteristics since two modes can be distinguished clearly and be operated independently in accordance with a specific embodiment of the present invention.

Figure 10:
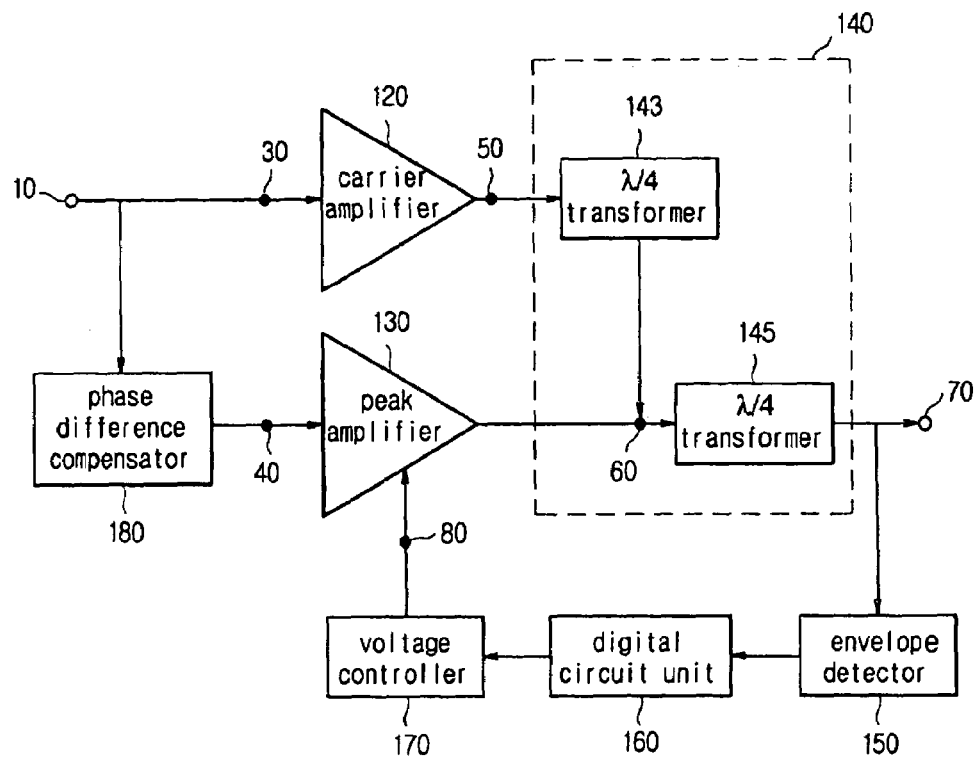
FIG. 10 is a block diagram showing the structure of a power amplifier in accordance with another embodiment of the present invention.

FIG. 10 is a block diagram showing the structure of a power amplifier in a mobile handset in accordance with another embodiment of the present invention. The power amplifier according to another embodiment of the present invention is substantially the same as the power amplifier 100 shown in FIG. 1, in terms of the structure and operation. Therefore, the same reference numerals refer to the same parts in the power amplifiers according to the FIG. 1 and FIG. 10. Thus, a detailed description of the power amplifier according in FIG. 10 is not necessary for one having ordinary skill in the art and thus is omitted.

As shown in FIG. 10, another exemplary power amplifier in accordance with another embodiment comprises a phase difference compensator 180 which replaces 3 dB hybrid coupler 110 of FIG. 1. Phase difference compensator 180 is coupled to input stage 10 and peak amplifier 130 so that the input signal is applied to peak amplifier 130 and to the carrier amplifier 120, where phase difference compensator 180 has a phase difference of 90° (λ/4).

As described above, because input signal applied to peak amplifier 130 and input signal applied to carrier amplifier 120 has a phase difference of 90° (λ/4) through the operation of the phase difference compensator 180, when the output powers from the carrier amplifier 120 and the peak amplifier 130 join in the output matching unit 140, there would be no phase difference and thus the optimum output power may be obtained.

If a phase difference compensator 180 is used instead of the 3 dB hybrid coupler 110, the phase difference compensator 180 may be implemented with one simple transmission line. Alternatively, the phase difference compensator 180 may be implemented with lumped elements because the simple transmission line may be approximated to inductance values. In this manner, the power amplifier may be implemented without a complex 3 dB hybrid coupler 110 or a large-size transmission line outside of the amplifier. Furthermore, because the phase difference compensator 180 may be integrated within a single chip and/or a single integrated circuit, the overall size of the power amplifier 100 may be reduced and the price of the power amplifier 100 may also be reduced.

Hereinafter, a detailed description will be given as to the operation of the power amplifier in a mobile handset implemented according to the present invention.

The envelope detector 150 detects the level of output power transmitted to the output stage 70 and supplies the detection result to the digital circuit unit 160. Then, the digital circuit unit 160 determines whether the output power level detected by the envelope detector 150 deviates from the low output power range Q and applies a control signal to the voltage controller 170 in accordance with the result of such determination. If the level of output power transmitted to the output stage 70 is within the low output power range Q (mode 0), the voltage controller 170 controls input DC-bias voltage applied to the peak amplifier 130 in such a manner that the power amplifier 100 is operated in the Doherty mode (i.e., so that the peak amplifier 130 is operated at class B or C). In contrast, if the level of output power transmitted to the output stage 70 deviates from the low output power range Q, (namely, in the high output power range) (mode 1), the voltage controller 170 controls input DC-bias voltage applied to the peak amplifier 130 in such a manner that the input DC-bias voltage applied to the peak amplifier 130 is increased so that the ACPR is improved up to point R where the non-linearity specification of the power amplifier 100 is satisfied.

Although several embodiments of the present invention have been disclosed for illustrative purposes, those skilled in the art will appreciate that various modifications, additions and substitutions are possible, without departing from the scope and spirit of the invention as disclosed in the accompanying claims.

As described above, an exemplary power amplifier of the present invention in a mobile handset that provides improves efficiency and linearity, by controlling an input DC-bias voltage applied to a peak amplifier according to the relevant output power levels has been shown. For example, in the low output power mode, input DC-bias voltage to the peak amplifier is controlled so that the power amplifier of the present invention is operated in the Doherty mode and, in the high output power mode, input DC-bias voltage to the peak amplifier is controlled to be increased so as to satisfy the non-linearity specification of the power amplifier.

Further, according to the present invention, the power amplifier can be implemented through well-known processes, and the size and/or the price of the power amplifier may be reduced because only input DC-bias voltage need be applied to the peak amplifier as it is controlled in a manner described herein.

Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. The scope of the invention is not limited to the described embodiments and is to be determined solely by the appended claims.

What is claimed is:

1. A method of operating a power amplifier in a wireless transmitting device in at least two modes, the power amplifier including a carrier amplifier and a peak amplifier, the method comprising:
generating a power amplifier output signal having a power amplifier output power level;
detecting the power amplifier output power level;
operating the power amplifier as a Doherty amplifier is the detected power amplifier output power level is within a first output power range; and
modifying operation of the peak amplifier so that the power amplifier operates to improve a non-linearity characteristic of the power amplifier if the detected power amplifier output power level is associated with a second output power range.

2. The method of claim 1, wherein modifying operation of the peak amplifier further comprises applying an input DC-bias voltage to the peak amplifier.

3. The method of claim 2, wherein applying the input DC-bias voltage further comprises determining whether the power amplifier output power level is at a specified level.

* * * * *